US008384365B2

(12) United States Patent
Maksimovic et al.

(10) Patent No.: US 8,384,365 B2
(45) Date of Patent: Feb. 26, 2013

(54) MULTI-PHASE MODULATOR

(75) Inventors: Dragan Maksimovic, Boulder, CO (US); Regan Zane, Superior, CO (US); Anthony Carosa, Breckenridge, CO (US)

(73) Assignee: The Regents of the University of Colorado, a Body Corporate, Denver, CO (US)

( * ) Notice: Subject to any disclaimer, the term of this patent is extended or adjusted under 35 U.S.C. 154(b) by 900 days.

(21) Appl. No.: 12/136,651

(22) Filed: Jun. 10, 2008

(65) Prior Publication Data

US 2008/0310200 A1 Dec. 18, 2008

Related U.S. Application Data

(60) Provisional application No. 60/944,483, filed on Jun. 15, 2007.

(51) Int. Cl.
*G05F 1/00* (2006.01)
(52) U.S. Cl. ........................................ 323/283
(58) Field of Classification Search .................. 323/282, 323/283, 284, 285
See application file for complete search history.

(56) References Cited

U.S. PATENT DOCUMENTS

| | | | | |
|---|---|---|---|---|
| RE38,846 E | * | 10/2005 | Walters et al. | 323/272 |
| 7,584,371 B2 | * | 9/2009 | Zhang | 713/310 |
| 7,773,016 B2 | * | 8/2010 | Miao | 341/142 |
| 2005/0110472 A1 | * | 5/2005 | Harris et al. | 323/271 |
| 2006/0055381 A1 | * | 3/2006 | Rice | 323/271 |
| 2006/0132110 A1 | * | 6/2006 | Tang | 323/282 |
| 2007/0035280 A1 | * | 2/2007 | Fujiyama et al. | 323/212 |
| 2007/0096704 A1 | * | 5/2007 | Jain et al. | 323/282 |
| 2008/0310200 A1 | * | 12/2008 | Maksimovic et al. | 363/65 |

OTHER PUBLICATIONS

Carosa, Tony et al., "Digital Multiphase Modulator—A Power D/A Perspecive", Colorado Power Electronics Center, Department of Electrical and Computer Engineering, University of Colorado, Boulder, CO 80309-0425, USA no date given, 6 pages.
Carosa, Tony et al., "Implementation of a 16 Phase Digital Modulator in a 0.35 um Process", Colorado Power Electronics Center, Department of Electrical and Computer Engineering, University of Colorado, Boulder, CO 80309-0425, USA no date given, 7 pages.
Foley, Raymond F. et al. "An area-efficient digital pulsewidth modulation architecture suitable for FPGA implementation", IEEE APEC 2005, vol. 3, pp. 1412-1418.
Garcia, O. et al. "Effect of the Tolerances in Multi-Phase DC-DC Converters", Power Electronics Specialists 2005, IEEE 36th Conference pp. 1452-1457.

(Continued)

*Primary Examiner* — Nguyen Tran
(74) *Attorney, Agent, or Firm* — Hamilton, DeSanctis & Cha LLP; Thomas J. Osborne, Jr.

(57) ABSTRACT

An architecture is described for digital multi-phase modulators (MPM) that leads to an efficient, high performance hardware realization. The combined modulator, switching phases and output filter can be viewed as a multi-level digital to analog converter with high power output, or a power D/A, and concepts used in D/A converters are leveraged to achieve high performance and hardware efficiency. The modulator can be split into three functional blocks including a decoder that determines how many phases are on at any time, a selector that determines which phases are on at any time, and a single high resolution module that is time shared among all phases. The resulting architecture scales favorably with a large number of phases, $f_s$, facilitates fast update rates of the input command well above the single phase switching frequency and is compatible with a wide range of known DPWM techniques for the LSB module and resolution-enhancement techniques such as dithering or $\Sigma$-$\Delta$ modulation.

29 Claims, 15 Drawing Sheets

OTHER PUBLICATIONS

Huang, Wenkang, "A new control for multi-phase buck converter with fast transient response", IEEE Applied Power Electronics Conference and Exposition 2001, APEC '01, pp. 273-279.

Huang, Wenkang, "The design of a high-frequency multiphase voltage regulator with adaptive voltage positioning and all ceramic capacitors", IEEE Applied Power Electronics Conference and Exposition 2005 pp. 270-275.

Lee, Kisun et al. "A novel control method for multiphase voltage regulators", IEEE Applied Power Electronics Conference and Exposition 2003, pp. 738-743.

Miao, Botao et al. "Automated digital controller design for switching converters", IEEE Power Electronics Specialists, 2005, pp. 2729-2735.

O'Malley, Eamon et al "A Programmable Digital Pulse width modulator providing versatile pulse patters and supporting switching frequencies beyond 15 MHz", IEEE APEC, vol. 1, 2004, pp. 53-59.

Peterchev, Angel V. et al., "Architecture and IC Implementation of a Digital VRM Controller", IEEE Transactions on Power Electronics, vol. 18, No. 1, Jan. 2003, pp. 356-364.

Peterchev, Angel V. et al. "Design of ceramic-capacitor VRM's with estimated load current feed forward", 35th Annual IEEE Power Electronics Specialists Conference, 2004, pp. 4325-4332.

Peterchev, Angel V. et al., "Quantization Resolution and Limit Cycling in Digitally Controlled PWM Converters", IEEE Transactions on Power Electronics, vol. 18, No. 1, Jan. 2003, pp. 301-308.

Prodic, Aleksandar et al. "Dead-zone digital controller for improved dynamic response of power factor preregulators", IEEE Applied Power Electronics Conference 2003, pp. 382-388.

Prodic, Aleksandar et al. "Self-turning digitally controlled low-harmonic rectifier having fast dynamic response", IEEE Transactions on Power Electronics, vol. 18, No. 1, Jan. 2003, pp. 420-428.

Qiu, Yang et al. "High-bandwidth designs for voltage regulators with peak-current control", IEEE Applied Power Electronics Conference and Exposition 2006, pp. 24-30.

Qiu, Yang et al. "The multi-frequency small-signal model for buck and multiphase interleaving buck converters", IEEE Applied Power Electronics Conference and Exposition 2005, pp. 392-398.

Soto, A. et al. "Non-linear digital control breaks bandwidth limitations", IEEE Applied Power Electronics Conference and Exposition 2006, pp. 724-730.

Van Tuijl, Ed et al. "A 128 f(subscript s) Multi-Bit Σ Δ CMOS Audio DAC with Real-Time DEM and 115 dB SFDR", IEEE International Solid-State Circuits Conference, vol. 11, 2004. 8 pages.

Wong, Pit-Leong et al., "Critical Inductance in Voltage Regulator Modules", IEEE Transactions on Power Electronics, vol. 17, No. 4, Jul. 2002, pp. 485-592.

Wong, Pit-Leong et al. "Voltage regulator module (VRM) transient modeling and analysis", IEEE Industry Applications Conference 1999, vol. 3, pp. 1669-1676.

Wu, Albert M. et al."Digital PWM Control: Application in Voltage Regulation Modules", IEEE Power Electronics Specialists Conference, vol. 1, 1999, pp. 77-83.

Yao, Kaiwei et al. "Optimal design of the active droop control method for the transient response", IEEE Applied Power Electronics Conference and Exposition 2003, pp. 718-723.

Yousefzadeh, Vahid et al. "Hybrid DPWM with Digital Delay-Locked Loop", IEEE workshop, Rensselaer Polytechnic Institute, Troy, NY, Jul. 16-19, 2006, pp. 142-148.

Zhang, Yang et al., "Wide-Bandwidth Digital Multi-Phase Controller", Colorado Power Electronics Center, University of Colorado, Boulder, CO 80309-0425, US, no date given, 7 pages.

Zhang, X. et al., "A Novel VRM control with direct lead current feedback", IEEE Applied Power Electronics Conference and Exposition 2004, vol. 1, pp. 267-271.

\* cited by examiner

MULTI-PHASE MODULATOR

CROSS-REFERENCE TO RELATED APPLICATIONS

This application claims the benefit of U.S. provisional application No. 60/944,483 filed 15 Jun. 2007, which is hereby incorporated by reference as though fully set forth herein.

BACKGROUND a. Field

The instant invention relates to a multi-phase modulator for a multi-phase power converter.

b. Background

A high performance multi-phase modulator (MPM) is a component in multi-phase power supplies. A number of previous approaches to realizing digital multi-phase modulators have followed the architecture of standard analog multi-phase pulse-width modulators (PWM) where a separate modulation ramp signal is generated for each phase, and the ramp signals are shifted in time by $T_s/N$, where $f_s=1/T_s$ is the per-phase switching frequency. An N-phase system requires N high-resolution digital pulse-width modulators, which limits the scalability of these approaches.

A different architecture, requiring a single high-resolution unit for an arbitrary number of phases has been described in R. F. Foley, R. C. Kavanagh, W. P. Marnane, and M. G. Egan, "A versatile digital pulsewidth modulation architecture with area-efficient FPGA implementation," IEEE PESC 2005, pp. 2069-2615 and R. F. Foley, R. C. Kavanagh, W. P. Marnane, M. G. Egan, "Multiphase digital pulsewidth modulator, IEEE Trans. on Power Electron., vol. 21, no. 3, pp. 842-846, May 2006. This approach is based on the assumption that all phases operate with exactly the same duty cycle over each switching period $T_s$, and that the pattern of switching transitions for individual phases can be determined based on the duty-cycle command once per switching period $T_s$. This architecture leads to an efficient, scalable hardware realization, but limits the update rate to the switching frequency $f_s$.

BRIEF SUMMARY

A multi-phase modulator for a multi-phase power converter is provided.

In one implementation, a multi-phase modulator for a multi-phase power converter comprises a a multi-phase power converter, a decoder, and a selector. The multi-phase power converter comprises a plurality of power converter phases. The decoder receives a digital input command and determines a first number of phases of the plurality of power converter phases to place in a first state based upon the digital input command. The selector identifies a first set of phases of the plurality of power converter phases to assign to the first state and a second set of phases of the plurality of power converter phases to assign to a second state.

In another implementation, a method of providing a multi-phase modulated thermometer-code digital command is provided. The multi-phase modulated thermometer-code digital command represents a first state and a second state for each of a plurality of bits corresponding to a plurality of phases of a multi-phase power converter to be controlled. The method comprises: receiving a digital input command; determining, from the digital input command, a first number of output bits of the modulated thermometer-code digital command to place in the first state; determining a first set of bits to be assigned a first value representing the first state and a second set of bits to be assigned a second value representing the second state; and providing the multi-phase modulated thermometer-code digital command to a multi-phase power converter comprising a plurality of power converter phases in which the first set of bits are assigned the first value representing the first state and the second set of bits are assigned the second value.

The foregoing and other aspects, features, details, utilities, and advantages of the present invention will be apparent from reading the following description and claims, and from reviewing the accompanying drawings.

DETAILED DESCRIPTION

Figure 1:
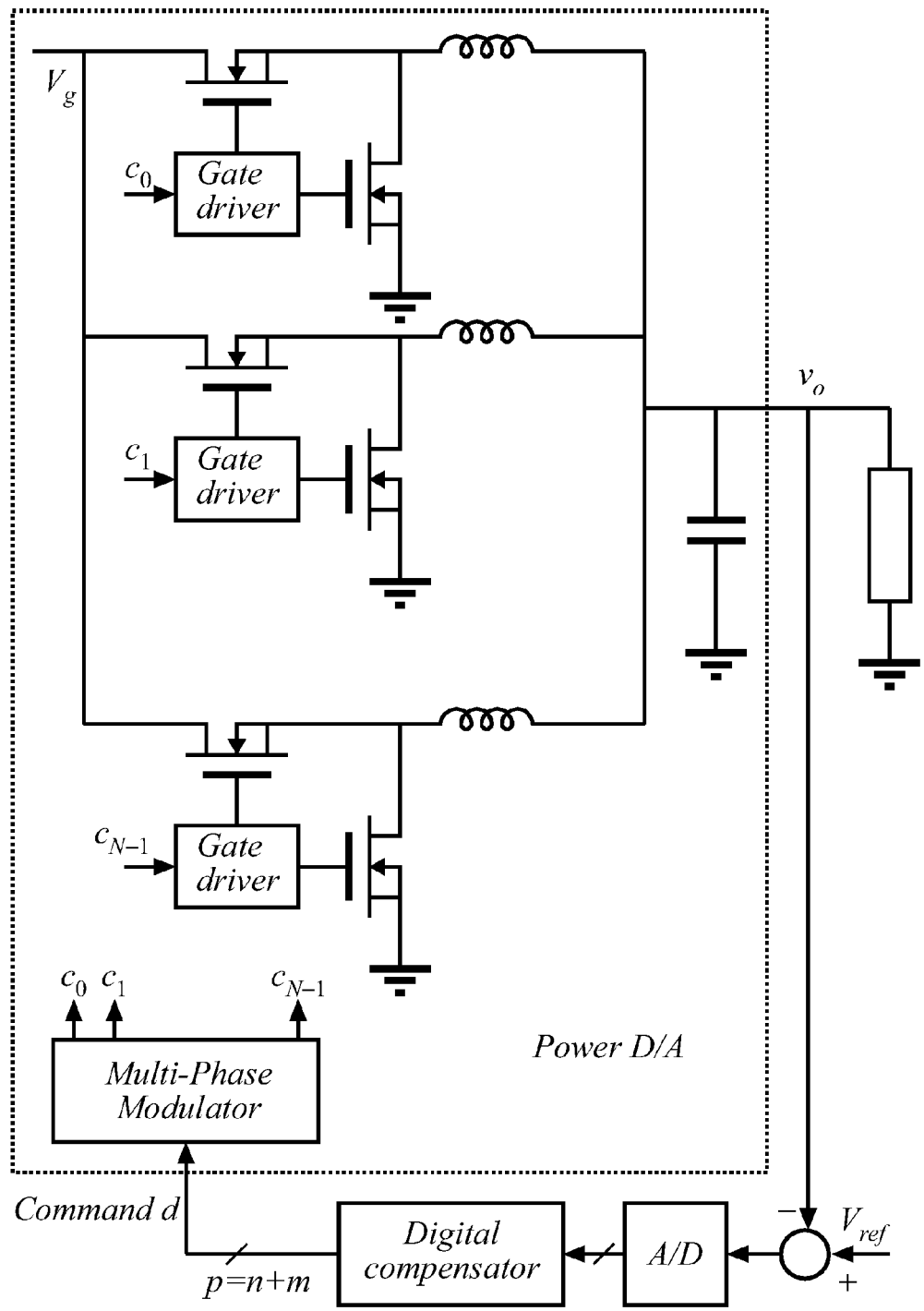
FIG. 1 shows one implementation of a multi-phase DC-DC converter with N phases operating in parallel.

FIG. 1 shows one implementation of a multi-phase DC-DC converter with N phases operating in parallel to achieve improved power scaling, ripple and dynamic performance. In the particular implementation shown in FIG. 1, for example, each of the N phases comprises a synchronous buck converter power stage. Other converter configurations that may be used in the power stage include buck converters, three-level or multi-level converters, step-up, step-down or up-down (buck-boost) converters, converters with coupled inductors, converters with isolation transformers, and monolithic power stages. Increasing the number of phases N is motivated by the potential for scalable monolithic integration and the possibility for closed-loop bandwidth to exceed the switching frequency limits. Architecture and realization of a high-performance digital multi-phase modulator (MPM) to support multi-phase systems with a large number of phases N is provided.

Figure 2:
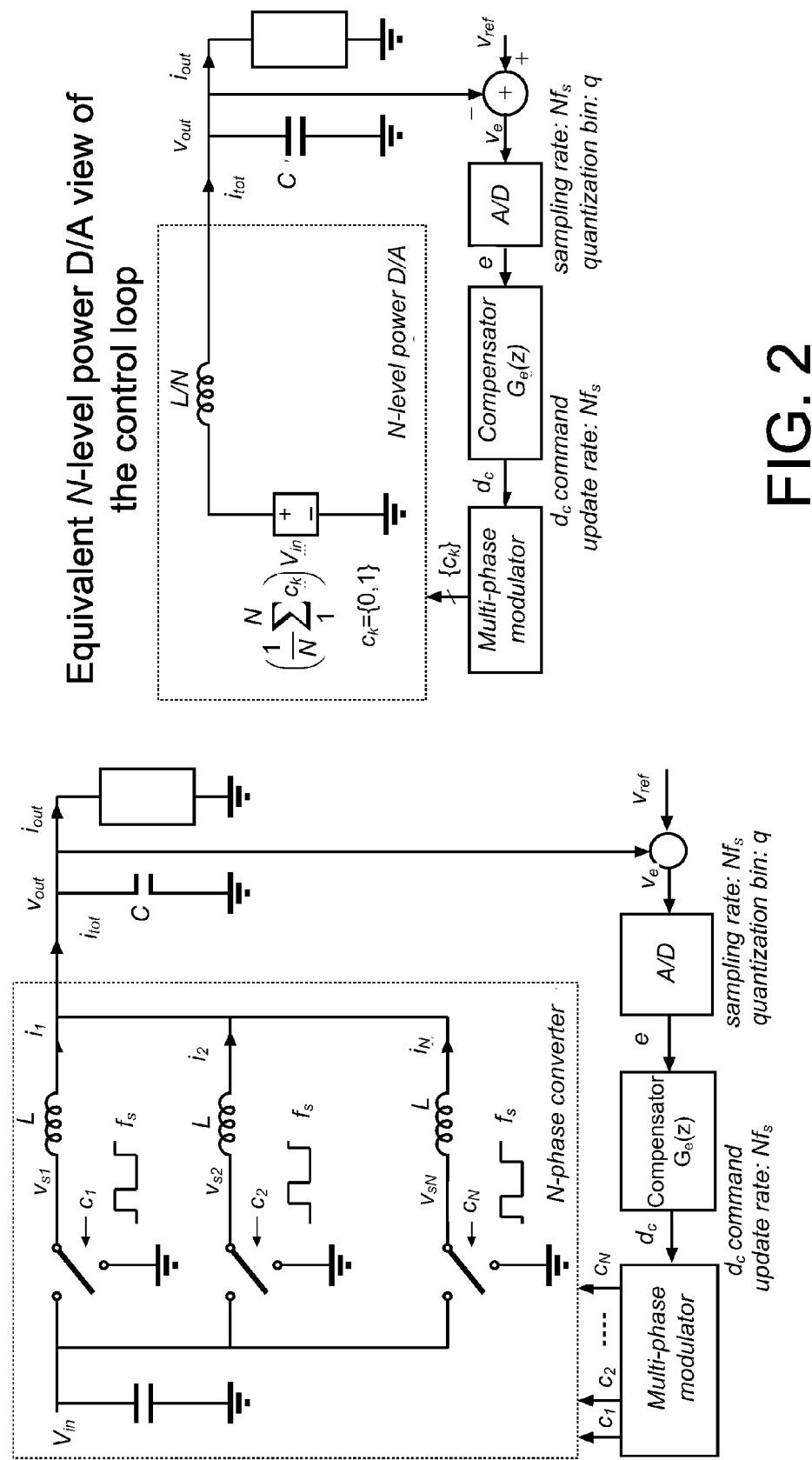
FIG. 2 shows an equivalent N-level power D/A view of the control loop of FIG. 1 using a Thevenin equivalent N-level power digital-to-analog (D/A) converter.

In this implementation, the MPM architecture and the realization is based on a multi-phase converter viewed as a multi-level digital-to-analog converter, or power D/A. See, e.g., Ed van Tuijl, J. van den Homberg, D. Reefman, C. Bastiaansen, L. van der Dussen, "A 128 fs multi-bit ΣΔ CMOS audio DAC with real-time DEM and 115 dB SFDR," *IEEE Solid-State Circuits Conference* 2004, vol. 11, pp. 368-369. FIG. 2 shows an equivalent N-level power D/A view of the control loop of FIG. 1 using a Thevenin equivalent N-level power digital-to-analog (D/A) converter.

A control system of the multi-phase DC-DC converter comprises an analog-to-digital (A/D) converter, a digital compensator and the multi-phase modulator. An output voltage of the N phase DC-DC converter is sampled and compared to a reference voltage $V_{ref}$ to generate an analog error signal. The reference voltage $V_{ref}$ can be dynamically programmed through a digital input. For example, there are numerous options in constructing the voltage A/D converter and the system reference value, including the following two architectures. In the first architecture, a window A/D converter can be centered around an analog reference voltage $V_{ref}$, where $V_{ref}$ can be digitally programmed through a digital-to-analog (D/A) converter. In the second architecture, an A/D converter with a conversion range can be set by an analog reference voltage. In this configuration, the system reference is a direct digital input.

The error signal is converted to a digital error signal by the A/D converter, which is provided to the digital compensator. The A/D converter, for example, may comprise a uniform, non-uniform or programmable quantization characteristic. The digital error signal (i.e., the digital equivalent of the difference between the sensed output voltage and the reference can be processed in a number of ways, including a combination of one or more of the following functional blocks: (a) linear discrete-time compensator, such as a PI or PID compensator; (b) nonlinear discrete-time compensator; (c) notch, comb, or other ripple cancellation filter; (d) linear or nonlinear processing of signals obtained by sensing or estimation of power-stage signal such as capacitor currents, inductor currents, inductor voltages, capacitor voltages, switch voltages, switch currents, or combinations of such power stage signals; (e) linear or nonlinear processing of power stage signals to achieve minimum-time responses to changes in load or reference; (f) processing blocks such as dither or sigma-delta modulators to improve effective system resolution; (g) blocks that facilitate auto-tuning of controller parameters; and (h) diagnostic blocks that facilitate system design, such as in a CAD environment, or improve system robustness or reliability.

As shown in FIG. 1, the digital compensator generates a p-bit digital command d and provides the digital command to the MPM, which determines how many and which phases are "on" ($c_i=1$) or "off" ($c_i=0$) at any given time in order to adjust the analog output voltage $v_o$. Although the compensator in FIG. 1 is a digital compensator, an alternative compensator design can be realized as an analog component, followed by an A/D converter to generate the command to the multi-phase modulator. The MPM architecture shown in FIG. 1 includes a single high-resolution module. In addition, the MPM input command d can be updated at any time, which opens the possibilities for wide-bandwidth closed-loop operation.

Further, although FIG. 1 shows the control loop sensing an output voltage, current-sensing can be added to accomplish one or a combination of the following: (a) improved current sharing, (b) adaptive voltage positioning (using any number of known approaches); (c) improved dynamic responses; and (d) protection.

When using two-state switching converters such as the synchronous buck converter phases shown in FIG. 1, each phase has a single logic high or low control signal, $c_i=\{0, 1\}$, that determines the state of the switches in that phase. The purpose of a digital multi-phase modulator is to generate the on/off control signals $\{c_0, c_1, \ldots, c_{N-1}\}$ for each of the N gate drives in the multi-phase converter system based on the high-resolution (p-bit) input command d. Although several examples refer to "on" or "off" states or "active" or "inactive" states, any other state may be selected. Further, two or more states may be selected by the MPM.

The MPM decides which phases are to be in a given state at a particular time. There are numerous ways to perform such a decision, including one or a combination of the following: (a) order of the phases and phase rotation; (b) activation of the phases to minimize mismatches in per-phase currents; and (c) activation of the phases to minimize the number of switching transitions, i.e., to minimize the system switching losses. The MPM may additionally implement one or a combination of the following additional functions: (a) phase re-ordering, static or dynamic, for example to reduce the effects of phase mismatches; and (b) adjusting the number of operating phases, statically or dynamically, for example to minimize losses at light loads.

Figure 3:
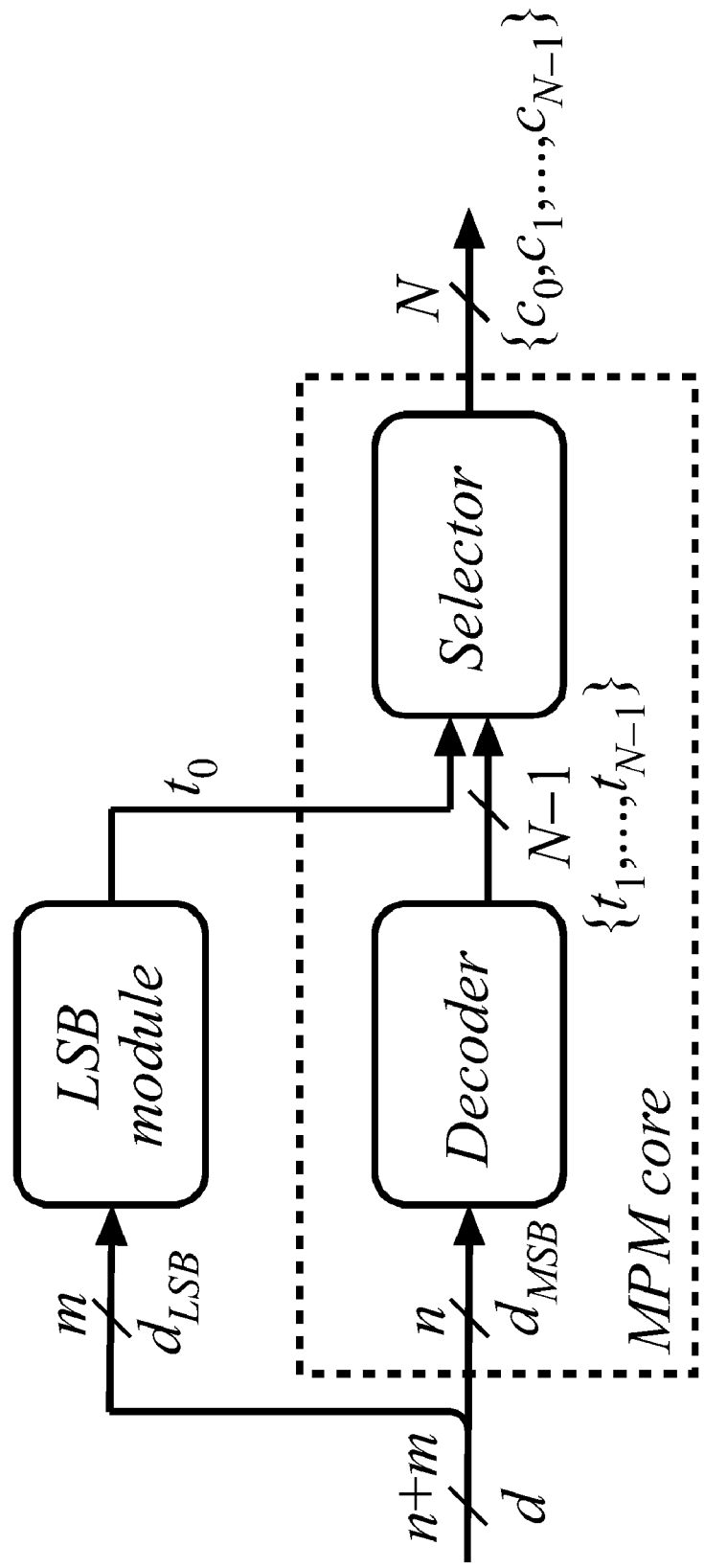
FIG. 3 shows a general block diagram of one implementation of an MPM architecture.

A general block diagram of the proposed MPM architecture is shown in FIG. 3. The high-resolution p-bit command d is split into an n-bit MSB (most-significant-bit) portion $d_{MSB}$ and an m-bit LSB (least-significant-bit) portion $d_{LSB}$, p=n+m. The MSB command $d_{MSB}$ is the input to the MPM core consisting of a Decoder and a Selector. Based on the input $d_{MSB}$, the Decoder sets the signals $t_i$ to decide how many phases are on. For example, to turn k phases on, we have:

$$t_i = \begin{cases} 1, & 1 \le i \le k \\ 0, & k+1 \le i \le N-1 \end{cases} \quad (1)$$

The Selector shown in FIG. 3 decides which k phases are on by mapping the signals $t_i$ to the phase on/off control signals $c_i$. Finally, a single LSB module complements the MPM core to achieve high resolution control based on the m-bit LSB input $D_{LSB}$. The architecture in FIG. 3 is very general. The fact that it resembles a standard D/A converter architecture leads immediately to a number of implementation options. For example, if all N phases are nominally identical (as in FIG. 1), the Decoder converts the binary input $d_{MSB}$ to a thermometer-code output $\{t_i\}$. If, instead, the phases are logarithmic, no decoding is necessary. If the individual power converters have high-impedance outputs, as is the case with converters having an inner current control loop, or with resonant converters, the Selector function is trivial, $c_i=t_i$. In contrast, in the standard multi-phase converter of FIG. 1, the Selector has to perform a time-dependent mapping from $\{t_i\}$ to $\{c_i\}$ to accomplish, for example, benefits of ripple minimization and equal current sharing. A number of options are also available for the single high-resolution LSB module, including auxiliary analog regulators, or various digital pulse-width modulation (DPWM) techniques. Finally, the MPM architecture of FIG. 3 allows applications of further resolution-enhancement techniques such as dithering or Σ-Δ modulation.

Figure 4A:
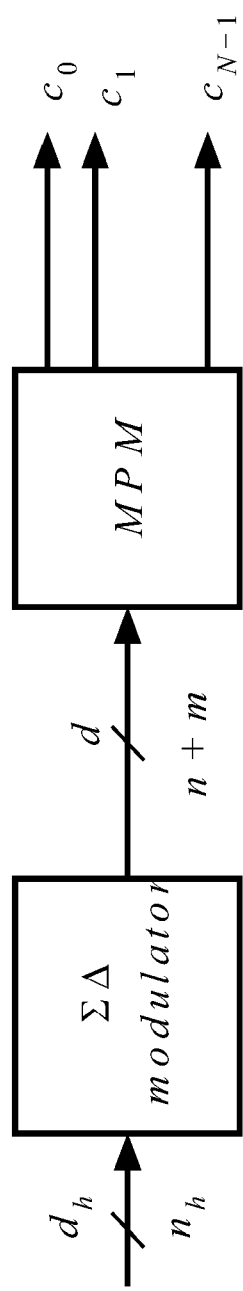
FIG. 4(A) shows an example of a resolution improvement using a sigma-delta ($\Sigma\Delta$) modulator in front of a multi-phase modulator.
Figure 4B:
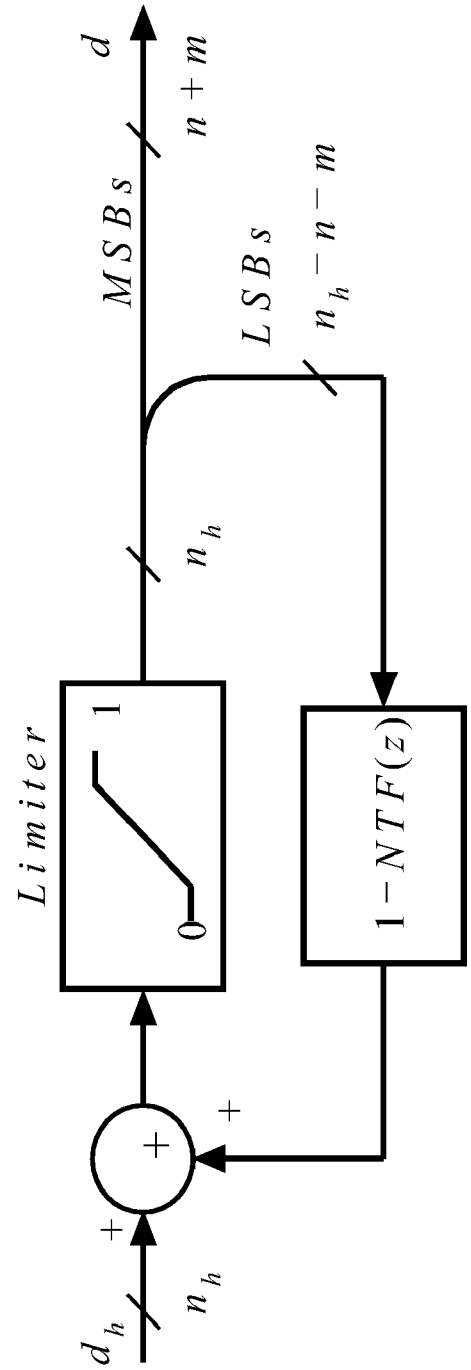
FIG. 4B shows an example implementation of a $\Sigma\Delta$ modulator following an error-feedback $\Sigma\Delta$ architecture.
Figure 5:
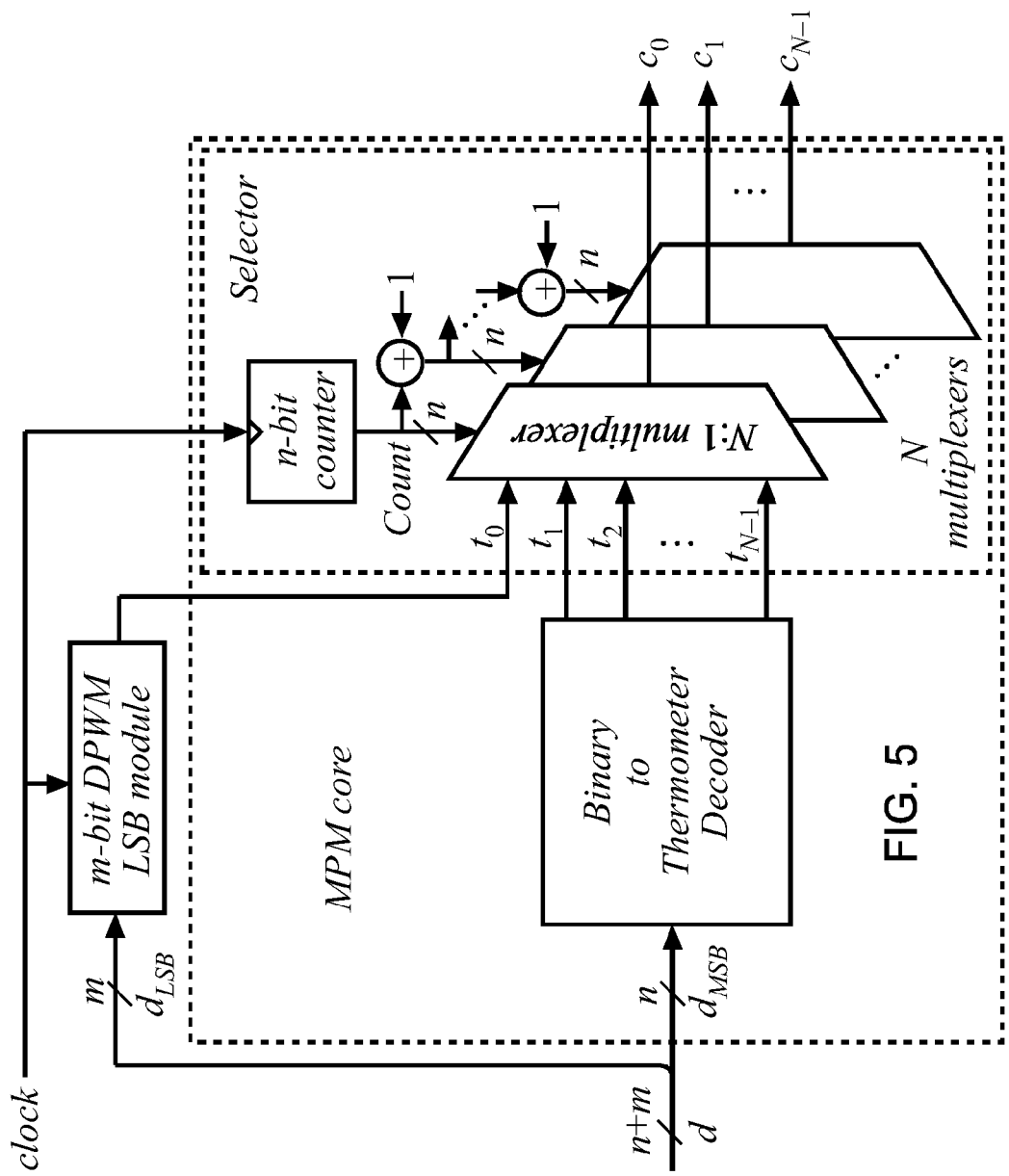
FIG. 5 shows one implementation of an MPM realization according to the architecture shown in FIG. 2.

FIG. 4(A) illustrates a resolution improvement using a ΣΔ modulator in front of an MPM. A high resolution $n_h$-bit command signal $d_h$ is the input o the ΣΔ modulator. The output of the ΣΔ modulator is the lower-resolution (n+m)-bit command signal d, which is the input to the MPM. An implementation of the ΣΔ modulator is shown in FIG. 4(B), following the error-feedback ΣΔ architecture with the noise transfer function NTF(z) designed to suppress the quantization noise at low frequencies using standard ΣΔ techniques. With the ΣΔ modulator in front, the multi-phase converter with the MPM behaves as a power D/A converter with enhanced resolution In an MPM realization for the multi-phase converter in FIG. 1, consider the case when all N phases are nominally identical, and the number of phases is a power of 2, $N=2^n$. An MPM realization according to the architecture of FIG. 3 is shown in FIG. 5. The binary-to-thermometer decoder sets the signals $t_i$ to turn on k phases according to the command dMsB. The static characteristic $$V_o = \frac{k}{N} V_g \quad (2)$$
$$= \left(\frac{1}{N} \sum_{i=1}^{N-1} t_i\right) V_g$$
$$= d_{MSB} V_g$$

resembles the characteristic of a standard N-level thermometer code D/A converter. It is important to note that formula (2) implies that the same output voltage level is generated regardless of which k phases are on. This is decided by the Selector, which performs a time-dependent mapping from $\{t_i\}$ to $\{c_i\}$. In the realization shown in FIG. 5, the mapping is done in a rotating manner that results in standard phase-shifted PWM outputs $\{c_i\}$ as illustrated by the waveforms in FIG. 4 for the case of N=4 phases, n=2. A single n-bit down counter (e.g. counts in reverse $\{2, 1, 0, 3, \ldots\}$) and N multiplexers can be used to achieve phase rotation. The LSB command $d_{LSB}$ is input to a single DPWM to generate the pulse-width modulated signal $t_0$. Hardware efficiency is achieved by time sharing the single high resolution DPWM output $t_0$ among all N phases. The Selector naturally appends the high resolution $t_0$ component to the falling edge of the on/off control signal $c_i$ designated by the phase rotation counter. In this particular implementation, phase rotation and the DPWM operate at a clock rate of $Nf_s$, where $f_s=1/T_s$ is the single phase switching frequency. Other clock rates both higher and lower than $Nf_s$ may be used, however. Similar solutions have been used in audio signal processing D/A converters to achieve high resolution and improved linearity by using phase shifting to allot equal time to each element in the D/A.

Figure 6:
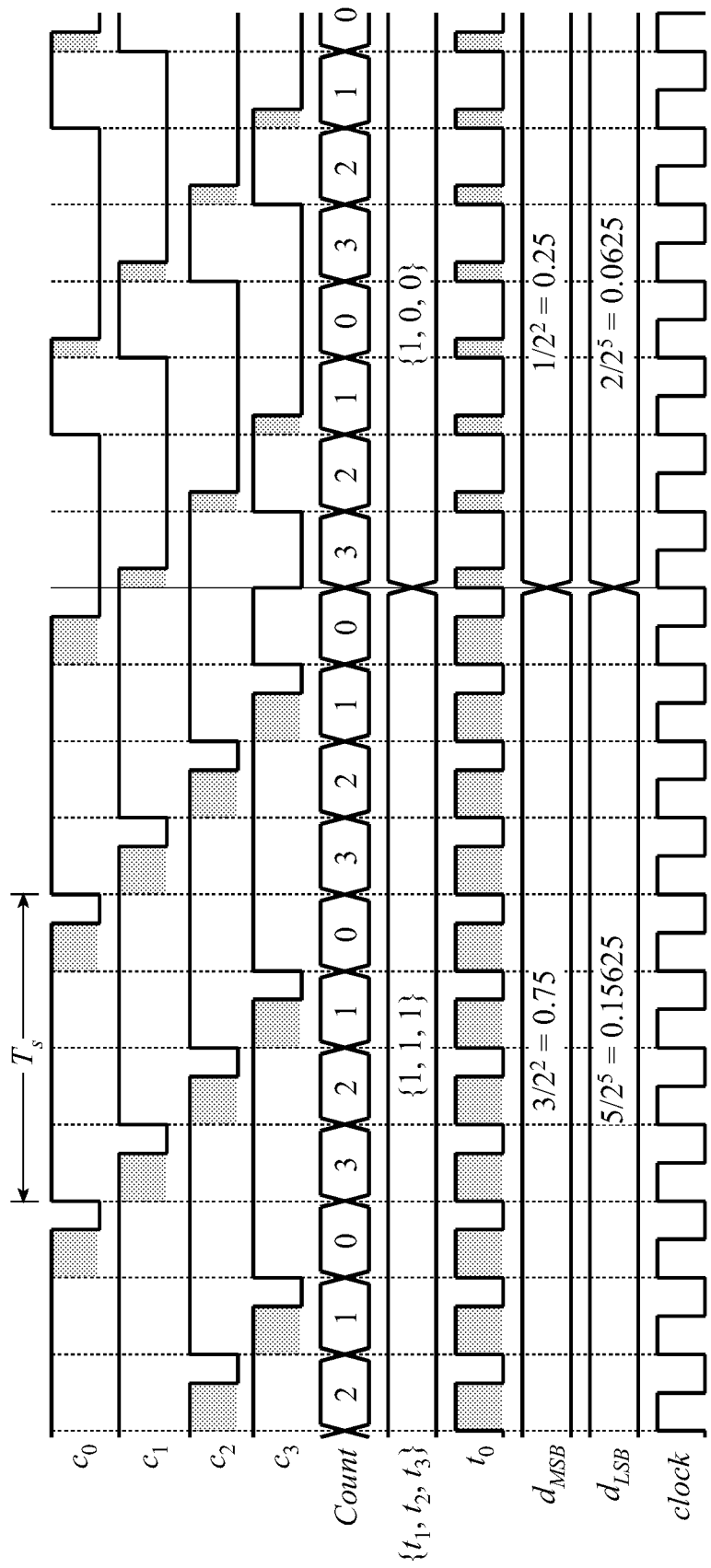
FIG. 6 shows an example timing diagram illustrating how MSB and LSB outputs are combined to generate phasing and duty cycle for a given input command.

In some implementations the MSB input command $d_{MSB}$ passes through the Decoder and the Selector directly to generate the on/off control signals $c_i$. This allows the input d to be updated at any time, for example at the rate of $Nf_s$ as shown in FIG. 6. For the $d_{MSB}$ command transition from ¾ to ¼, the number of on phases switches from 3 to 1 instantaneously. The fast update rate and the ability to change the number of phases that are on at any time opens the possibilities for wide-bandwidth closed-loop operation as described in Y. Zhang, X. Zhang, R. Zane, D. Maksimovic, "Wide-bandwidth digital multi-phase controller," *IEEE PESC* 2006 and X. Zhang, Y. Zhang, R. Zane, D. Maksimovic, "Design and implementation of a wide-bandwidth digitally controlled 16-phase converter," *IEEE Workshop on Computers in Power Electronics*, COMPEL 2006, pp. 106-111, each of which is hereby incorporated by reference in its entirety as if fully disclosed herein.

EXAMPLE

A custom IC was developed and tested based on the architecture shown in FIG. 2 for a 16 phase output, n=4, N=16. The IC was fabricated in a 0.35μ CMOS process and includes two complete versions of the digital MPM. Both versions include identical copies of the MPM core but with different types of DPWM LSB modules: counter and delay-line based. The area requirements for each of the modules and total MPM designs are shown in Table I.

TABLE I

SUMMARY OF PHYSICAL AREA FOR THE TWO MPM VERSIONS AND MODULES

| Module | Area |
| --- | --- |
| Counter-based MPM | 0.04 mm² |
| MPM Core | 0.03 mm² |
| Counter LSB | 0.01 mm² |
| Delay-line based MPM | 0.23 mm² |
| MPM Core | 0.03 mm² |
| Delay-line LSB | 0.20 mm² |

The delay-line based MPM was designed for a clock signal frequency, $f_{clock}=N\cdot f_s=64$ MHz, resulting in a single phase switching frequency $f_s=4$ MHz. The delay-line LSB was designed using a digital delay-locked loop (DLL) to self-tune to the clock input with a 2:1 tuning range, as introduced in V. Yousefzadeh, T. Takayama, D. Maksimović, "Hybrid DPWM with digital delay-locked loop," *IEEE Workshop on Computers in Power Electronics*, COMPEL 2006, pp. 142-148, with a $d_{LSB}$ resolution m=5 (timing resolution of 488 ps).

The counter based MPM was designed for a clock signal frequency, $f_{clock}=9.4$ MHz, resulting in a single phase switching frequency $f_s=586$ kHz. The LSB module uses an internal high frequency clock of $16\cdot f_{clock}=150$ MHz to achieve a $d_{LSB}$ resolution m=4 (timing resolution of 6.6 ns).

The counter based MPM was designed for a clock signal frequency, $f_{clock}=9.4$ MHz, resulting in a single phase switching frequency $f_s=586$ kHz. The LSB module uses an internal high frequency clock of $16\cdot f_{clock}=150$ MHz to achieve a $d_{LSB}$ resolution m=4 (timing resolution of 6.6 ns).

Figure 7:
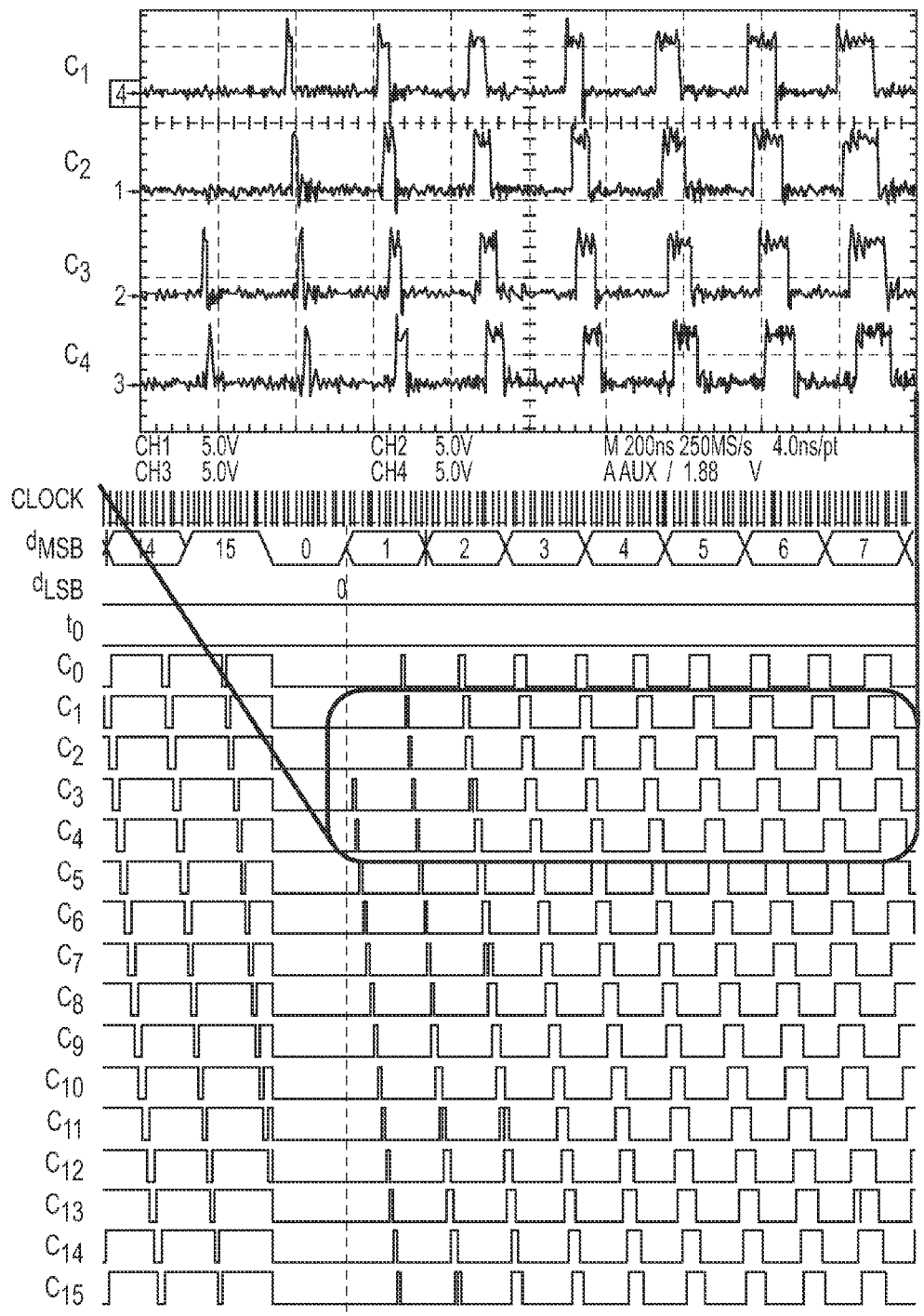
FIG. 7 shows experimental results for a digital MPM.
Figure 8:
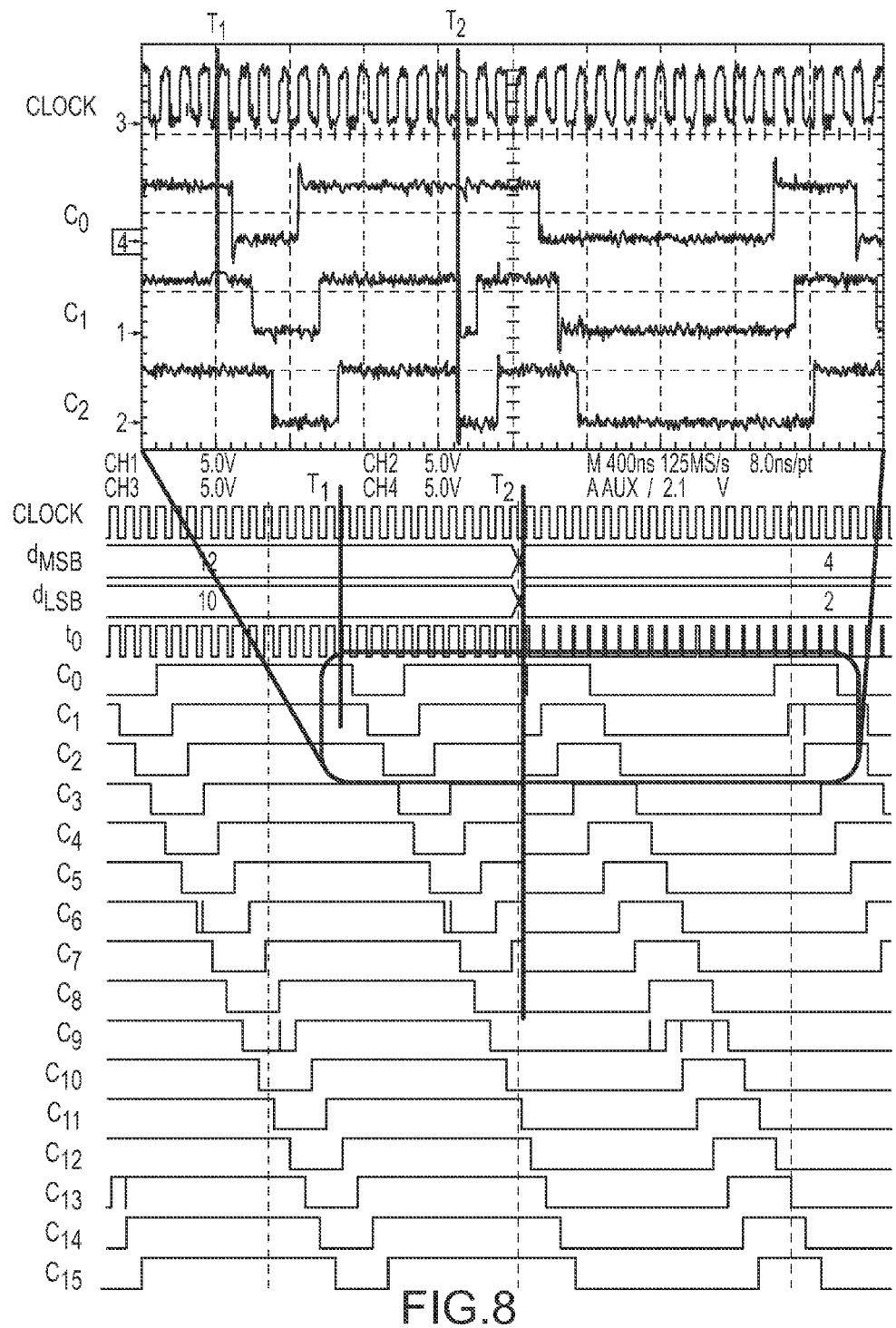
FIG. 8 shows experimental results for a digital MPM.

Experimental results for the digital MPM are shown in FIGS. 7 and 8. All results were captured using an Agilent 1681AD logic analyzer to capture all sixteen phase outputs and a Tektronix TDS7104 oscilloscope, triggered from the logic analyzer to correlate the waveforms. FIG. 6 shows the outputs of the delay-line based MPM as the input d is sequenced through all possible values of $d_{MSB}$ with $d_{LSB}=0$. Note that all outputs turn off immediately when the input steps from d=15 to d=0. FIG. 7 shows the outputs of the counter based MPM around a step change in both the $d_{MSB}$ and $d_{LSB}$ components of the input d. Again, note the direct feed-through of the $d_{MSB}$ command to the outputs at the fast update rate, $f_{clock}=N\cdot f_s$ Wide-Bandwidth MPM Implementation In one implementation, a multi-phase modulator may utilize a wide-bandwidth digital control method that enables a closed-loop bandwidth that scales with $Nf_s$. This approach is closely tied to the equivalent view of the N-phase converter as an N-level power D/A converter as shown in FIG. 2. In the equivalent N-level power D/A converter circuit, the equivalent voltage source level ($V_g/N$, $2V_g/N$, ..., $kV_g/N$, up to $V_g$)

can be set by an N-bit thermometer-code digital command $d_c=\{c_k\}$ where $c_k=\{1,0\}$ decides whether the phase k is active ($V_g$) or inactive (0), by controlling the on/off state of the power switches. Assuming $N=2^n$, it is therefore appropriate to view the multi-phase converter as an n-bit power D/A converter. In the n-bit D/A converter, the control command of how many phases are active can, in principle, be given at any time. To equalize the phase currents and to minimize switching losses, the modulator takes the task of deciding which phases are active. In steady-state, the command $d_c$ is constant, and the steady-state operation is exactly the same as in the conventional multi-phase realization with per-phase switching frequency equal to $f_s$. However, given that the output voltage is sampled at the rate of $Nf_s$, and the power D/A command is updated at the same rate, the discrete-time compensator can be designed using digital control techniques to achieve the system closed-loop bandwidth proportional to $Nf_s$ rather than the per-phase switching frequency $f_s$.

Figure 9:
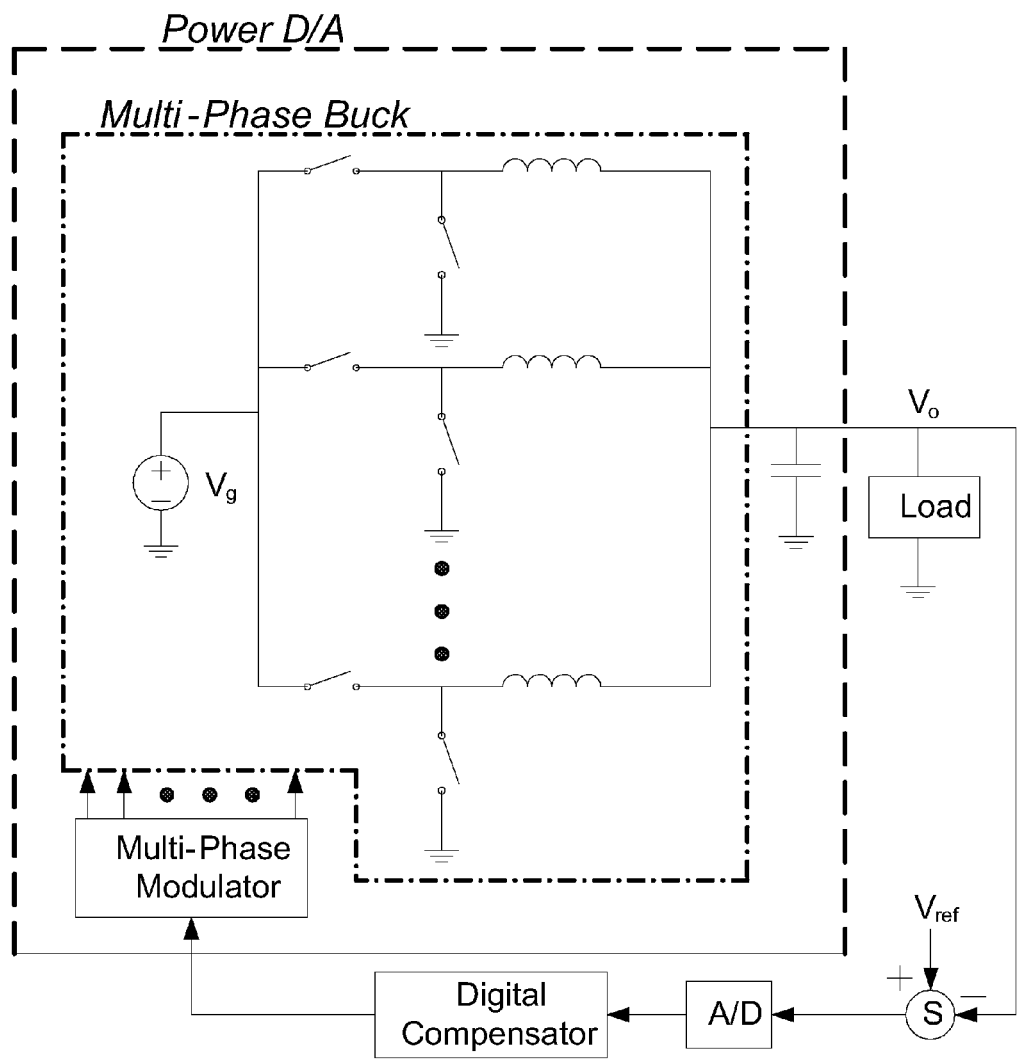
FIG. 9 shows an implementation of a controller architecture for a multi-phase DC-DC converter with N phases operating in parallel.
Figure 10:
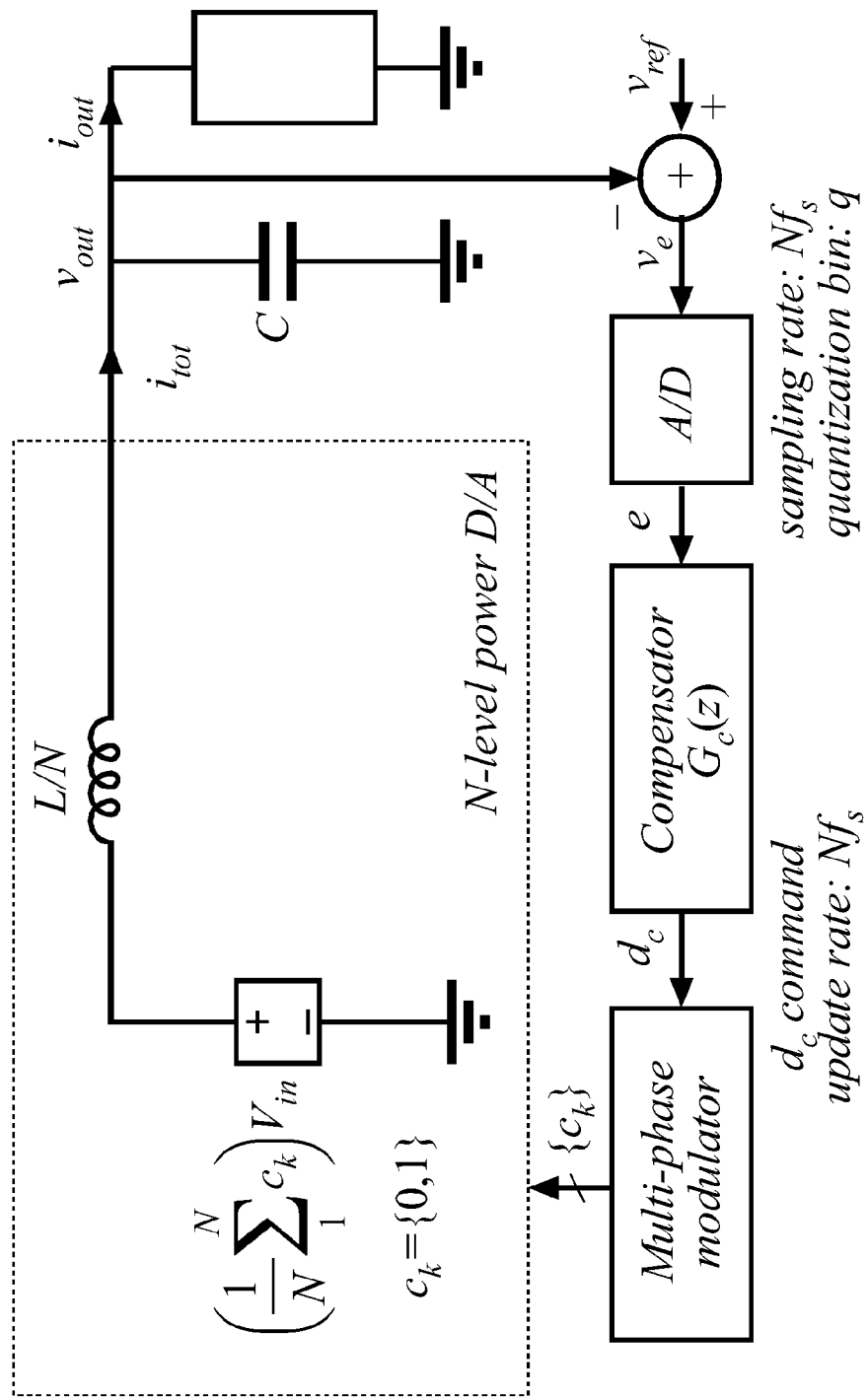
FIG. 10 shows an example of a block diagram of the system of FIG. 9 including a power D/A N-level view of the N-phase converter.

One implementation of a controller architecture is shown in FIG. 9. The system comprises a voltage A/D converter, a digital compensator and a multi-phase modulator. FIG. 10 shows a block diagram of the system including the power D/A N-level view of the N-phase converter. The output voltage $v_{out}$ is sensed and compared to the reference $V_{ref}$. An error signal $v_e$ is sampled and converted to the digital error signal e at the rate of $Nf_s$. Assuming $N=2^n$, the n most significant bits(MSB) of the command $d_c$ represent how many phases should be active in the next sampling interval ($T_s/N$). The multi-phase modulator can execute this MSB command immediately, with delays due only to the gate-driver propagation delays. It should be noted that, for example, all the phases can be turned active or inactive at the same time as directed by the compensator. This feature may be built into the controller architecture and enabled by the MPM realization, and does not require any specific non-linear action. The remaining least-significant bits (LSB) of the command $d_c$ can be treated as a PWM command to the modulator, which provides a high resolution to provide for precise output voltage regulation. In steady-state conditions, the command $d_c$ can be constant, and the steady-state operation can be the same as a conventional multi-phase PWM realization with a per-phase switching frequency equal to $f_s$. However, given that the output voltage is sampled at the rate of $Nf_s$, and the N-level power D/A command is updated at the same rate, the discrete time compensator can be easily designed using standard linear (e.g., PI or PID) digital control techniques to achieve a system closed-loop bandwidth proportional to $Nf_s$.

Based on a converter discrete-time model $G_{vdz}(z)$, a linear digital compensator Gc(z) can be designed directly in discrete time using any of the available methods. Two design examples are provided below.

In the first example, following the direct-digital design approach disclosed in B. Miao, R. Zane, D. Maksimovic, "Automated digital controller design for switching converters," IEEE Power Electronics Specialists, 2005, pp. 2729-2735, targeting the cross-over frequency of fc=fs provides the following:

$$G_c(z) = 26.1 \frac{z(z^2 - 1.923z + 0.9251)}{(z-1)(z-0.66673)(z+0.2835)} \quad (3)$$

The system loop gain is $$T(z) = G_{vdz}(z)G_c(Z) \quad (4)$$

Figure 11:
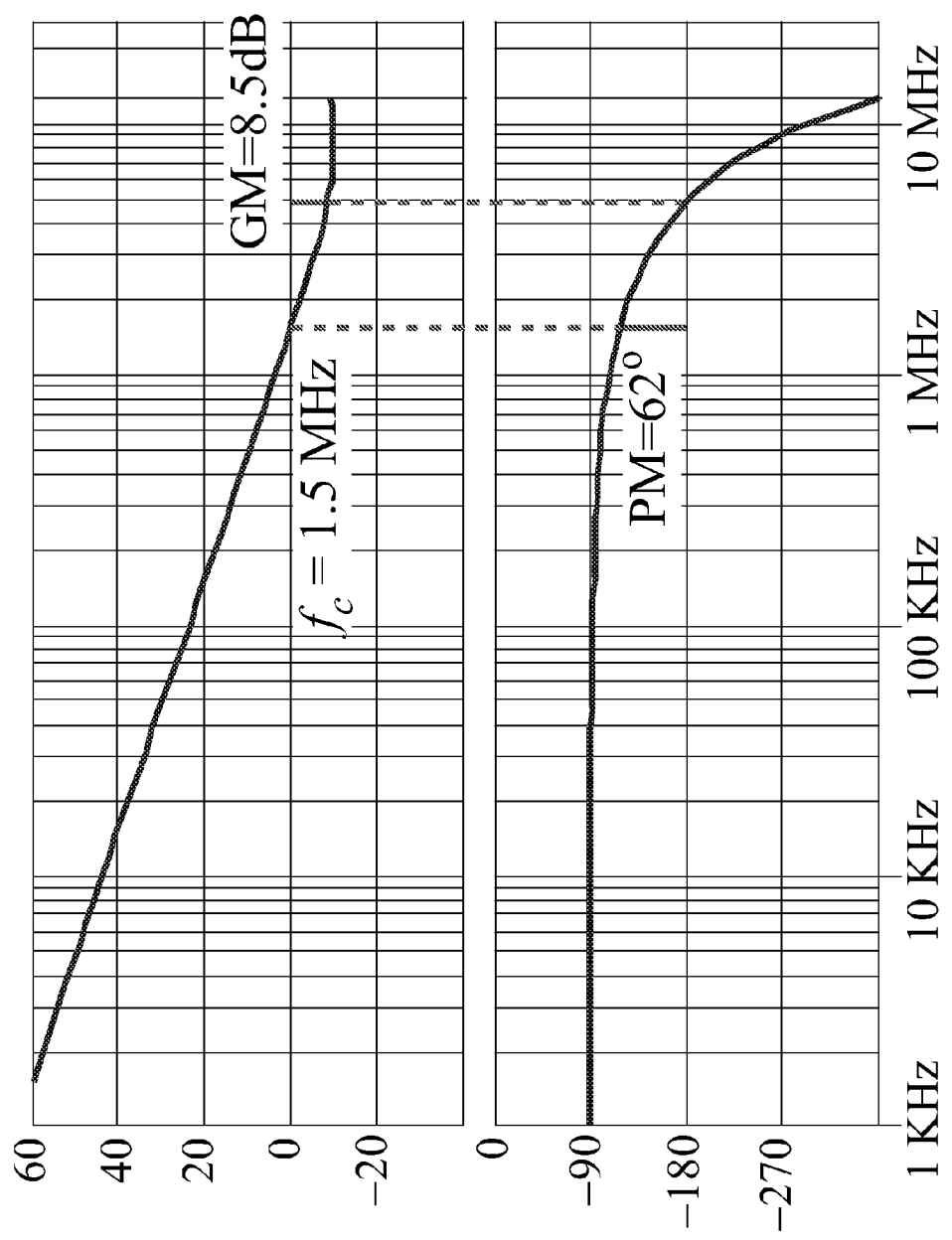
FIG. 11 shows magnitude and phase responses of a system loop gain for an example multi-phase DC-DC converter.
Figure 12:
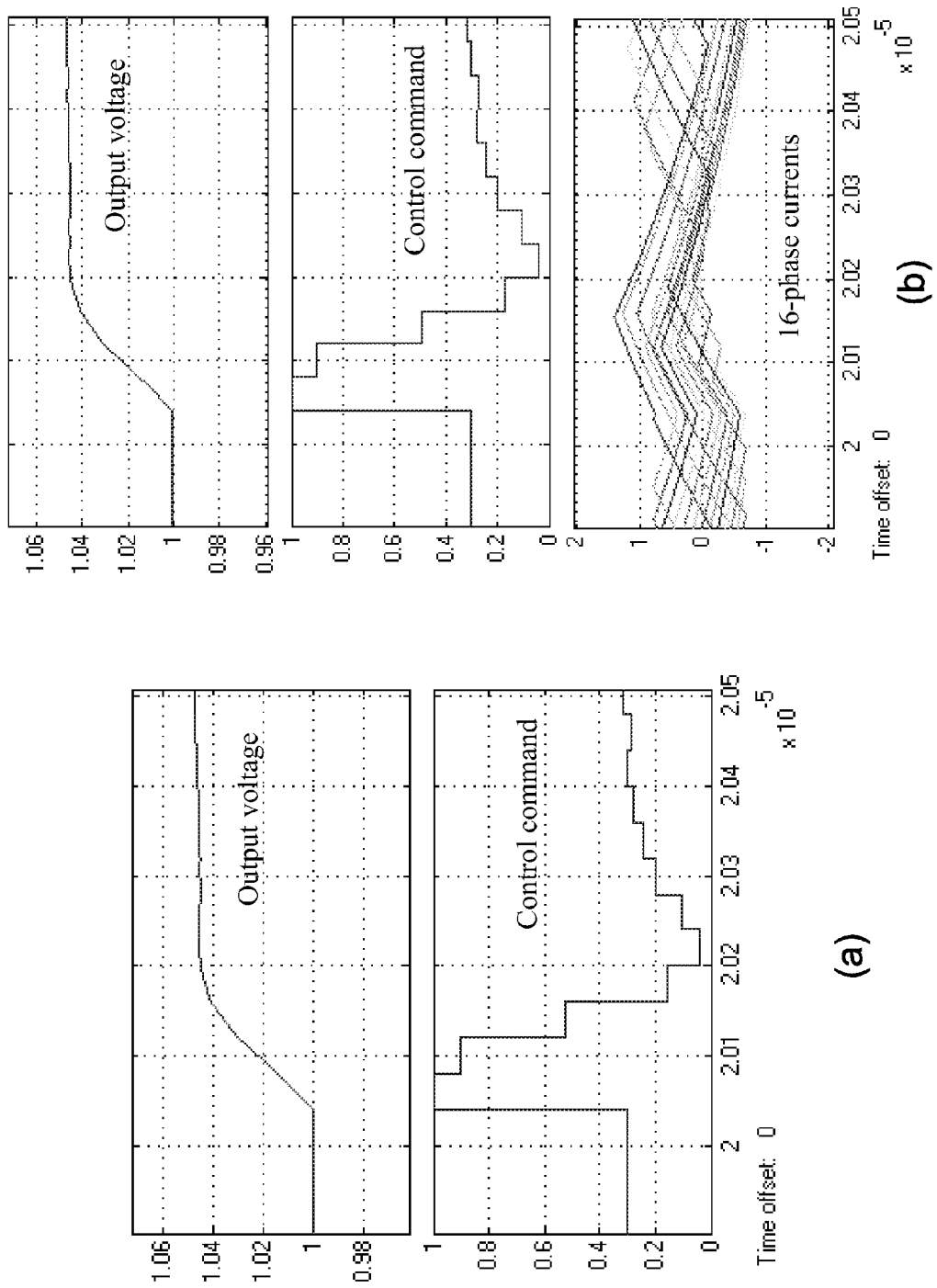
FIG. 12 shows example step-reference transient simulation results for (a) a 16-level power D/A model, and (b) a complete 16-phase switching converter.

Magnitude and phase responses of the system loop gain are shown in FIG. 11. The crossover frequency $f_c$, i.e., the closed-loop bandwidth is equal to 1.5 MHz, which is approximately equal to the per-phase switching frequency $f_s=1.56$ MHz. The phase margin is 62° and the gain margin is 8.5 dB. FIG. 12 shows example step reference (1V to 1.05V) transient simulation results for (a) a 16-level power D/A model, and (b) a complete 16-phase switching converter. The results show that the multi-level model is adequate for the design of the control loop, even though the model neglects modulation effects associated with the LSB pulse-width modulation. The very fast response times are on the order of 150 ns, shorter than the per-phase switching period.

Figure 13:
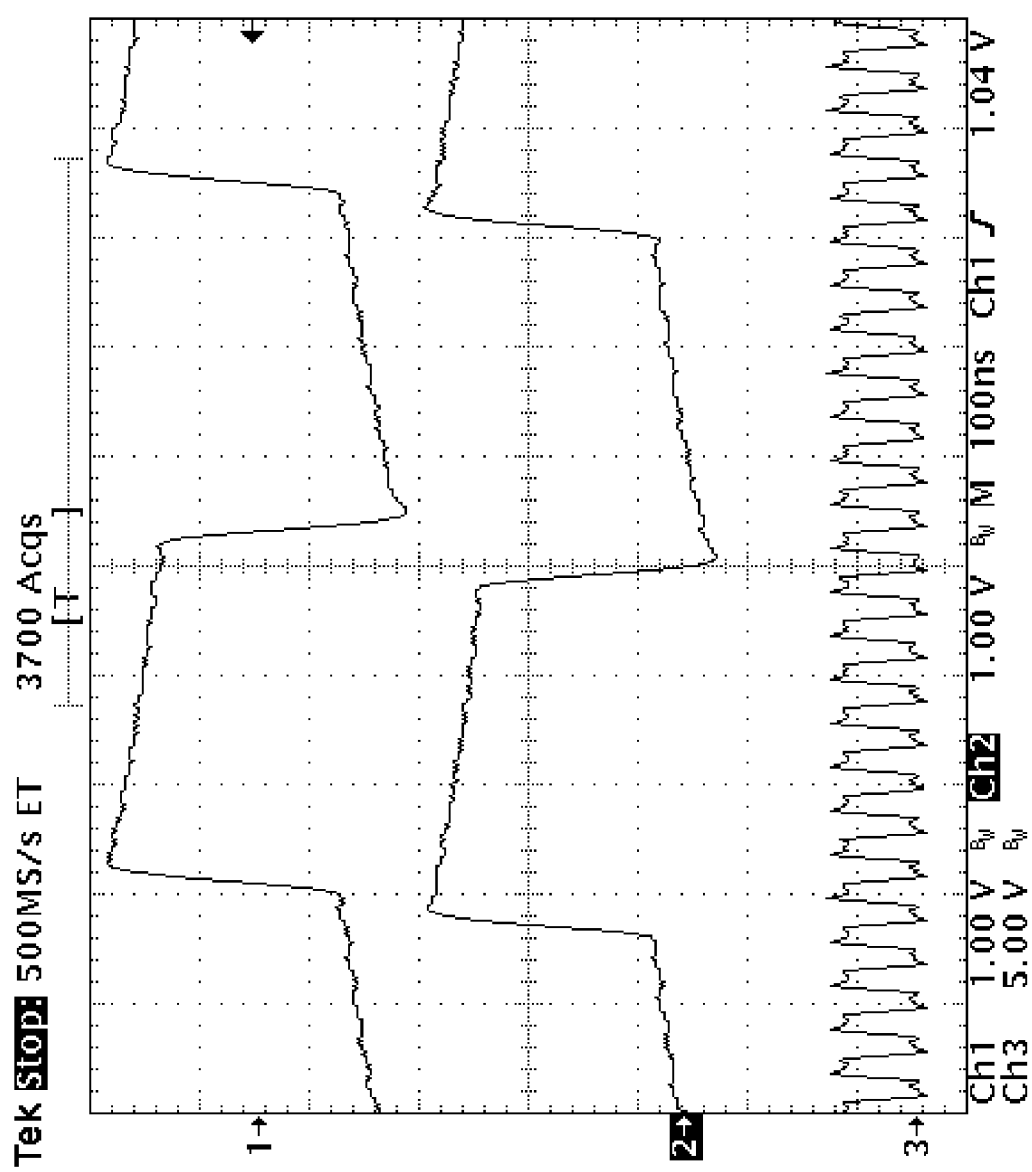
FIG. 13 shows a system 25 MHz MSB clock, a sampling rate, and switch-node voltages $v_s$ for two consecutive phases.

FIG. 13 shows a system 25 MHz MSB clock, which in this implementation is equal to the sampling rate, and switch-node voltages $v_s$ for two consecutive phases. The slopes in the $v_s$ voltages are due to the relatively large per-phase current ripples and relatively large on-resistances of the driver power MOSFETs. Ideally, the phase delay between two consecutive phases is equal to the MSB clock period of 40 ns. It can be observed that there are driver propagation delay mismatches, which also contribute to the non-ideal ripple cancellations, as discussed above.

Figure 14:
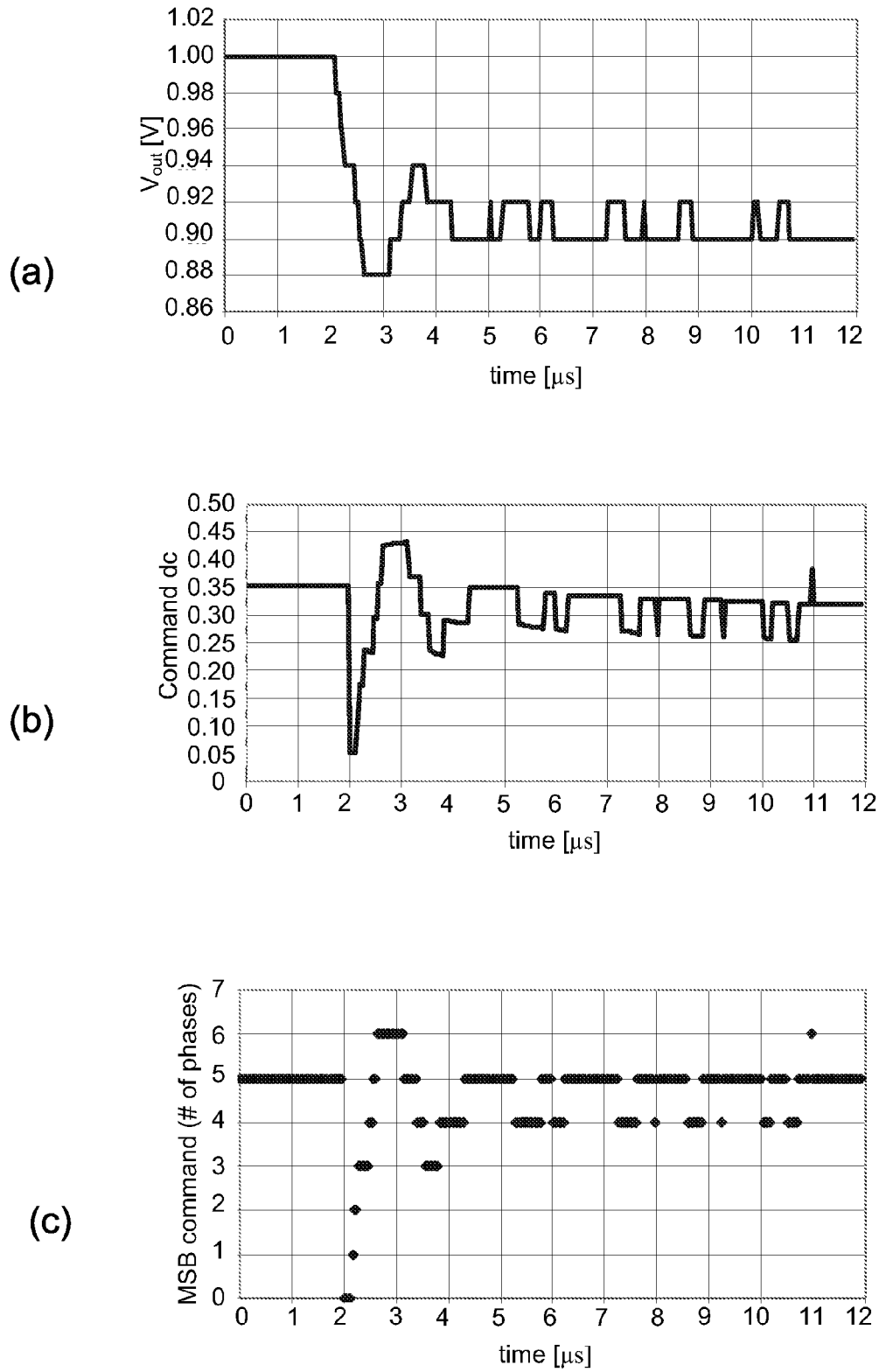
FIG. 14 shows experimental step-load transient waveforms captured from an FPGA controller using an on-chip logic analyzer.
Figure 15:
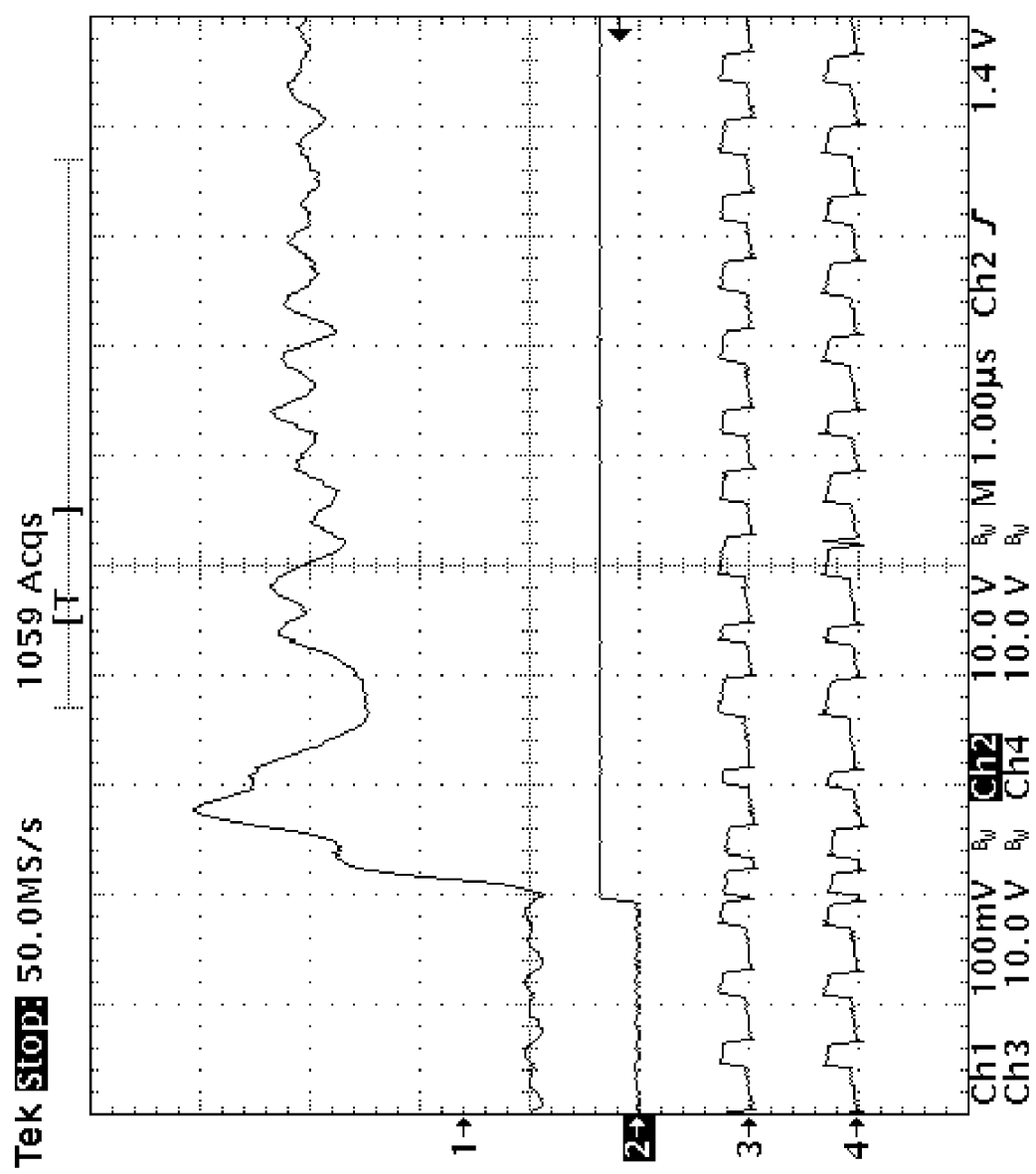
FIG. 15 shows another example experimental step reference response.

FIGS. 14(A) through 14(C) show experimental step-load transient waveforms captured from an FPGA controller using an on-chip logic analyzer. FIG. 14(A) shows an output voltage after an A/D conversion with a bin size q=20 mV. FIG. 14(B) shows the digital command $d_c$. FIG. 14(C) shows how the MSB command, i.e., the number of phases that are on, drops abruptly from 5 to 0 at the beginning of the reference step-down transient. Finally, FIG. 15 shows a larger (0.9V to 1.V) experimental step reference response.

CONCLUSION

A digital multi-phase modulator that leads to an efficient, high performance hardware realization is provided. The modulator and converter system is viewed as a multi-level power D/A to achieve improved performance and hardware efficiency. The modulator can be split into three functional blocks including a decoder that determines how many phases are on at any time, a selector that determines which phases are on at any time and a single LSB module that is time shared among all phases to achieve high resolution in steady-state. The resulting architecture scales favorably with a large number of phases, facilitates fast update rates of the input command well above the single phase switching frequency and is compatible with a wide range of known DPWM techniques for the LSB module and resolution-enhancement techniques such as dithering or $\Sigma$-$\Delta$ modulation. Experimental results are also provided for a custom IC realization in a 0.35µ CMOS process, designed for 16 phase output with an input command update rate of 16 times $f_s$. Two complete 16 phase MPM designs were verified on the IC with different high resolution modules, including a delay-line based design achieving 9-bit PWM resolution at $f_s=4$ MHz and a counter based design achieving 8-bit PWM resolution at $f_s=586$ kHz.

In one example, a method of wide-bandwidth digital control is provided for interleaved multi-phase digital converters. The method is based on a view of a multi-phase converter as a multi-level power D/A converter where the output voltage is sampled and the command is updated at a rate of $Nf_s$, where $f_s$ is the per-phase switching frequency and N is the number of phases. This view enables a very efficient multi-phase modulator design. Furthermore, in contrast to alternative approaches where the bandwidth is limited to a fraction of the switching frequency $f_s$ a bandwidth that scales with $Nf_s$ is achievable. System model and linear digital compensator designs are provided. A zero-error bin approach, which is inherent to the digital controller implementation, is proposed to address the effects of phase-mismatches, and sub-harmonic ripples on the stability of the wide-bandwidth controller. Simulation and experimental results are also shown for a 16-phase synchronous buck converter operating at 1.56 MHz per-phase switching frequency.

Although embodiments of this invention have been described above with a certain degree of particularity, those skilled in the art could make numerous alterations to the disclosed embodiments without departing from the spirit or scope of this invention. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A multi-phase modulator for a multi-phase power converter comprising
a multi-phase power converter comprising a plurality of power converter phases;
a decoder that receives a digital input command and determines a first number of phases of the plurality of power converter phases to place in a first state based upon the digital input command, the decoder generating a plurality of logic signals corresponding to the first number of phases based upon the digital input command; and
a selector that identifies a first set of phases of the plurality of power converter phases to assign to the first state and a second set of phases of the plurality of power converter phases to assign to a second state, wherein the selector comprises a plurality of multiplexers and each of the plurality of multiplexers comprising an input coupled to receive one of the plurality of logic signals and an output coupled to one of the plurality of power converter phases.

2. A multi-phase modulator according to claim 1 wherein the decoder comprises a binary-to-thermometer code decoder.

3. A multi-phase modulator according to claim 1 further comprising a least-significant-bit (LSB) module that is time shared among all phases to increase resolution of the multi-phase modulator.

4. A multi-phase modulator according to claim 1 wherein the selector further determines a third number of phases of the plurality of power converter phases to place in a third state based upon the digital input command.

5. A multi-phase modulator according to claim 1 wherein the digital input command is updated at a frequency greater than or equal to a switching frequency $f_s$, wherein $f_s$ comprises a switching frequency of the plurality of power converter phases of the multi-phase power converter.

6. A multi-phase modulator according to claim 1 wherein the digital input command is updated at a frequency of $Nf_s$, wherein N comprises a number of power converter phases and $f_s$ comprises a switching frequency of the power converter phases.

7. A multi-phase modulator according to claim 1 wherein the digital input command is output from a sigma-delta modulator.

8. A multi-phase modulator according to claim 1 wherein the selector identifies the first set of phases of the plurality of power converter phases to assign to the first state and the second set of phases of the plurality of power converter phases to assign to a second state based upon a sequencing of phases to reduce switching ripple at the output of said multi-phase power converter.

9. A multi-phase modulator according to claim 1 wherein the selector identifies the first set of phases of the plurality of power converter phases to assign to the first state and the second set of phases of the plurality of power converter phases to assign to a second state based upon an activation of phases to reduce mismatches in per-phase currents.

10. A multi-phase modulator according to claim 1 wherein the selector identifies the first set of phases of the plurality of power converter phases to assign to the first state and the second set of phases of the plurality of power converter phases to assign to a second state based upon an activation of phases to reduce a number of switching transitions.

11. A multi-phase modulator according to claim 1 wherein the multi-phase modulator is a component of a closed-loop system.

12. A multi-phase modulator according to claim 11 wherein the closed-loop system comprises an analog compensator comprising a signal from the plurality of power converter phases as an input and an analog output and an analog-to-digital converter receiving the analog compensator output as an input and producing the digital input command as its output.

13. A multi-phase modulator according to claim 11 wherein an analog-to-digital converter samples a signal of the plurality of power converter phases and a digital compensator provides the digital input command based upon the sampled signal of the plurality of power converters.

14. A multi-phase modulator according to claim 13 wherein the signal of the plurality of power converters comprises an output voltage of the plurality of power converter phases.

15. A multi-phase modulator according to claim 14 wherein the output voltage is sampled at a frequency greater than or equal to $f_s$, wherein $f_s$ comprises a switching frequency of the plurality of power converter phases.

16. A multi-phase modulator according to claim 14 wherein the output voltage is sampled at a frequency of $Nf_s$, wherein N comprises a number of power converter phases and $f_s$ comprises a switching frequency of the plurality of power converter phases.

17. A multi-phase modulator according to claim 13 wherein the signal of the plurality of power converters comprises at least one current of the plurality of interleaved converters.

18. A multi-phase modulator according to claim 11 wherein the closed loop system comprises a bandwidth proportional to $Nf_s$, wherein N comprises a number of phases and $f_s$ comprises a switching frequency of the plurality of power converter phases.

19. A multi-phase modulator according to claim 11 wherein the closed loop system comprises a bandwidth that increases with a number of the plurality of power converter phases.

20. A method of providing a multi-phase modulated thermometer-code digital command representing a first state and a second state for each of a plurality of bits corresponding to a plurality of phases of a multi-phase power converter to be controlled, the method comprising:
   receiving a digital input command;
   determining, from the digital input command, a first number of output bits of the modulated thermometer-code digital command to place in the first state;
   determining a first set of bits to be assigned a first value representing the first state and a second set of bits to be assigned a second value representing the second state; and
   providing the multi-phase modulated thermometer-code digital command to a multi-phase power converter comprising a plurality of power converter phases via a plurality of multiplexers coupled to the plurality of power converter phases in which the first set of bits are assigned the first value representing the first state and the second set of bits are assigned the second value, wherein the plurality of multiplexers each include an input adapted to receive one of the bits of the multi-phase modulated thermometer-code digital command.

21. A method according to claim 20 further comprising time sharing an LSB module among all phases to increase resolution.

22. A method according to claim 20 further comprising determining a third set of bits to be assigned to a third state based upon the digital input command.

23. A method according to claim 20 wherein the multi-phase modulated thermometer-code digital command comprises a digital control command for a closed-loop system.

24. A method according to claim 23 wherein the closed-loop system comprises a plurality of interleaved converters.

25. A method according to claim 24 wherein the plurality of interleaved converters comprises a plurality of interleaved synchronous buck converters.

26. A method according to claim 20 wherein the multi-phase modulated thermometer-code digital command can be updated independently of a number of phases.

27. A method according to claim 20 wherein the multi-phase modulated thermometer-code digital command can be updated at a rate greater than a switching frequency of the plurality of power converter phases.

28. A method according to claim 20 wherein the digital input command is output from a sigma-delta modulator.

29. A multi-phase modulator according to claim 1 wherein each of the plurality of multiplexers is configured to output a control signal to one of the plurality of power converter phases, the control signal adapted to determine a state of one or more switches of the one of the plurality of power converter phases.

* * * * *